(12) United States Patent
Ose

(10) Patent No.: US 6,475,627 B1
(45) Date of Patent: Nov. 5, 2002

(54) SEMICONDUCTOR WAFER AND VAPOR GROWTH APPARATUS

(75) Inventor: Hiroki Ose, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/582,415

(22) PCT Filed: Oct. 28, 1999

(86) PCT No.: PCT/JP99/05968

§ 371 (c)(1),
(2), (4) Date: Jun. 26, 2000

(87) PCT Pub. No.: WO00/26948

PCT Pub. Date: May 11, 2000

(30) Foreign Application Priority Data

Oct. 29, 1998 (JP) .......................................... 10-326034

(51) Int. Cl.[7] .............................................. C30B 29/06
(52) U.S. Cl. ....................... 428/446; 428/64.1; 428/620
(58) Field of Search ................... 428/446, 620, 428/64.1

(56) References Cited

U.S. PATENT DOCUMENTS

| | | |
|---|---|---|
| 5,755,878 A | 5/1998 | Habuka et al. |
| 5,834,363 A * | 11/1998 | Masanori .................... 438/507 |
| 6,245,647 B1 * | 6/2001 | Akiyama et al. .......... 438/478 |
| 6,309,458 B1 * | 10/2001 | Habuka et al. ................ 117/93 |

FOREIGN PATENT DOCUMENTS

| | | | |
|---|---|---|---|
| EP | 709489 | | 5/1996 |
| EP | 784106 | | 7/1997 |
| EP | 0798765 A | * | 10/1997 |
| JP | 59-36927 | | 2/1984 |
| JP | 5-226263 | | 9/1993 |
| JP | 8-124859 | | 5/1996 |
| JP | 9-194296 | | 7/1997 |

* cited by examiner

Primary Examiner—Deborah Jones
Assistant Examiner—Stephen Stein
(74) Attorney, Agent, or Firm—Snider & Associates; Ronald R. Snider

(57) ABSTRACT

It is the object of the present invention to provide not only a semiconductor wafer obtained by forming a semiconductor thin film with uniform resistivity and substantially no slip dislocation on a main surface of a semiconductor single crystal substrate having a relatively low dopant concentration, as large as 300 mm or more in diameter but also a vapor phase growth apparatus by means of which such a semiconductor wafer can be produced. A dopant gas is supplied into a reaction chamber 10 through all of the inlet ports 18a to 18f disposed in a width direction of the reaction chamber 10 from a common gas pipe 22a functioning as a main dopant gas pipe. Further, the dopant gas is additionally supplied through inner inlet ports 18a and 18b, and middle inlet ports 18c and 18d, as specific gas inlet ports, into the reaction chamber 10 from first and second auxiliary dopant gas pipes 22b and 22c.

10 Claims, 6 Drawing Sheets

SEMICONDUCTOR WAFER AND VAPOR GROWTH APPARATUS

TECHNICAL FIELD

This invention relates to a semiconductor wafer and a vapor phase growth apparatus and particularly, a semiconductor wafer obtained by forming a semiconductor thin film having a uniform resistivity distribution on a main surface of a large diameter semiconductor single crystal substrate and a vapor phase growth apparatus employed for producing the semiconductor wafer.

BACKGROUND ART

In company with recent miniaturization of an electronic device, not only has the use of semiconductor wafers each obtained by forming a silicon single crystal thin film on a main surface of a silicon single crystal substrate increased, but a more uniform resistivity distribution of the silicon single crystal thin film has also been required. The term "uniform resistivity distribution" used here, to be detailed, means that a resistivity distribution across the surface of the silicon single crystal thin film is uniform. Further, a larger diameter has also been demanded on a semiconductor wafer together with the uniform resistivity distribution. A horizontal, single wafer vapor phase growth apparatus has been mainly employed as an apparatus for growing a silicon single crystal thin film on a main surface of a silicon single crystal substrate keeping pace with use of a large diameter semiconductor wafer.

Description will be below given of a horizontal, single wafer vapor phase growth apparatus generally employed with reference to FIGS. 5 and 6, wherein FIG. 5 is a sectional view in a horizontal plane showing a conventional horizontal, single wafer vapor phase growth apparatus in a simplified manner and FIG. 6 is a vertical sectional view showing the apparatus in a simplified manner.

As shown in FIGS. 5 and 6, in a conventional horizontal, single wafer vapor phase growth apparatus, a susceptor 14 on which a silicon single crystal substrate 12 is horizontally placed is disposed at the bottom of the middle portion of a transparent quartz glass reaction chamber 10 installed along a horizontal direction and the susceptor 14 is coupled with a rotation unit (not shown) through a rotary shaft 16.

Further, a gas inlet port 18 is provided at one end in a length direction of the reaction chamber 10 and a gas outlet port 20 is provided at the other end thereof. With this construction, a flow of a gas which is introduced through the gas inlet port 18 into the reaction chamber 10 and discharged through the gas outlet port 20 to the outside passes over a main surface of the silicon single crystal substrate 12 placed on the susceptor 14 almost along a length direction of the reaction chamber 10. Further, the gas inlet port 18 of the reaction chamber 10 is constructed of six inlet ports 18*a* to 18*f* spread in a width direction of the reaction chamber 10. Among the six inlet ports 18*a* to 18*f*, a pair of two inlet ports at the innermost side (hereinafter simply referred to as inner inlet ports) 18*a* and 18*b* are arranged in symmetry with respect to an imaginary central axis along a length direction of the reaction chamber 10, passing through the center of the main surface of the silicon single crystal substrate 12 on the susceptor 14, and this arrangement of the inner inlet ports 18*a* and 18*b* applies to not only a pair of two inlet ports at the outermost side (hereinafter simply referred to as outer inlet ports) 18*e* and 18*f*, but also a pair of two inlet ports each between one of the two inner inlet ports and the corresponding one of the two outer inlet ports (hereinafter simply referred to as middle inlet ports) 18*c* and 18*d* in the same way.

To be more detailed, the inner inlet ports 18*a* and 18*b* are directed toward points in the vicinity of the center of the main surface of the silicon single crystal substrate 12 on an imaginary central axis along a width direction of the reaction chamber 10, passing through the center of the main surface of the silicon single crystal substrate 12 on the susceptor 14, and the outer inlet ports 18*e* and 18*f* are directed toward points in the vicinity of the outer periphery of the main surface of the silicon single crystal substrate 12 on the imaginary central axis line and the middle inlet ports 18*c* and 18*d* are directed toward points between the central portion and the outer peripheral portion of the main surface of the silicon single crystal substrate 12 on the imaginary central axis line.

Further, the six inlet ports 18*a* to 18*f* are all connected to a common gas pipe 22. The common gas pipe 22 are branched in three ways and the branches are connected to a gas source (not shown) of hydrogen ($H_2$) gas as a carrier gas, a gas source (not shown) of a semiconductor raw material gas and a gas source (not shown) of a dopant gas through mass flow controllers MFC 24, 26 and 28, respectively, as gas flow rate regulators.

Further, outside of the reaction chamber 10, an infrared radiation lamp 30, for example, as a heat source heating the silicon single crystal substrate 12 placed on the susceptor 14 is disposed and by supplying a power to the infrared radiation lamp 30, the main surface of the silicon single crystal substrate 12 is heated to a predetermined temperature. In addition, cooling means (not shown) for cooling the infrared radiation lamp 30 and an outer wall of the reaction chamber 10 is equipped and thus, a so-called cold-wall vapor phase growth apparatus is constituted. In the cold-wall vapor phase growth apparatus, since the outer wall surface of the reaction chamber 10 is forcibly cooled, deposits composed mainly of silicon on the inner wall surface of the reaction chamber 10 can be prevented from forming.

Then, description will be made of a method for forming a silicon single crystal thin film on the main surface of the silicon single crystal substrate 12 using the conventional horizontal, single wafer vapor growth apparatus shown in FIGS. 5 and 6. First, the silicon single crystal substrate 12 is horizontally placed on the susceptor 14 of the reaction chamber 10. Following this, $H_2$ gas is supplied into the reaction chamber 10 from the gas source of $H_2$ gas through MFC 24, the common gas pipe 22 and through the six inlet ports 18*a* to 18*f* to replace the atmosphere in the reaction chamber 10 with hydrogen. Further, with the rotation device, the susceptor 14 is rotated through the rotary shaft 16 clockwise as shown by arrow marks of FIGS. 5 and 6 while the silicon single crystal substrate 12 is horizontally placed on the susceptor 14. Then, with the infrared radiation lamp 30, the silicon single crystal substrate 12 on the susceptor 14 is heated to raise a temperature of the main surface thereof to a predetermined one.

After doing so, the semiconductor raw material gas and the dopant gas are supplied into the reaction chamber 10 from the respective gas sources of the semiconductor raw material gas and the dopant gas through MFC 26 and 28, the common gas pipe 22 and the six inlet ports 18*a* to 18*f*.

At this time, not only are flow rates of $H_2$ gas as a carrier gas, the semiconductor raw material gas and the dopant gas controlled individually and precisely by MFC 24, 26 and 28, respectively, but the gases are also mixed after the individual control and introduced into the reaction chamber 10 as a process gas having the raw material gas and the dopant gas of respective constant concentrations with almost no diffusion in a width direction through the six inlet ports 18a to 18f disposed in a width direction of the reaction chamber 10.

The process gas introduced into the reaction chamber 10 passes over the main surface of the silicon single crystal substrate 12 placed horizontally on the susceptor 14 rotating about the rotary shaft 16 as a center in one direction and in almost parallel to the main surface. During the passage over the main surface, a chemical reaction arises to grow the silicon single crystal thin film 32 in vapor phase on the main surface of the silicon single crystal substrate 12.

In a case where a silicon single crystal thin film 32 was formed on the main surface of the silicon single crystal substrate 12 using the conventional horizontal, single wafer vapor phase growth apparatus shown in FIGS. 5 and 6 as described above, and when the diameter of a silicon single crystal substrate 12 was 200 mm or less, a resistivity distribution along a diameter of the silicon single crystal thin film 32 formed on a main surface of the silicon single crystal substrate 12 was almost uniform.

However, when a dopant concentration of the silicon single crystal substrate 12 was relatively as low as of the order of $10^{15}$ atoms/cm$^3$ and the diameter of a silicon single crystal substrate was 200 mm or more, for example a diameter of as large as 300 mm, it was found that there was a problem since a slip dislocation was generated in a peripheral region of a silicon single crystal thin film 32 with ease. If an integrated circuit is fabricated in a region with slip dislocation generated, leakage of a current in the circuit occurs problematically.

The following are conceived as a cause for generation of slip dislocation: That is, in a cold-wall vapor phase growth apparatus, when a silicon single crystal substrate 12 is heated by a uniform heating power, there arises a tendency that a temperature along a peripheral portion of the silicon single crystal substrate 12 is lower than a temperature in the central portion under an influence of a thermal condition that the outer wall surface of the reaction chamber 10 is forcibly cooled by a coolant. Such a tendency becomes conspicuous in a case of a diameter as large as 300 mm, a temperature difference between a peripheral portion and a central portion of a silicon single crystal substrate becomes large enough to generate slip dislocation.

Therefore, it is conceived that in order to prevent generation of slip dislocation in a peripheral portion of a silicon single crystal thin film 32, a power heating the peripheral portion of the silicon single crystal substrate 12 is regulated so as to be higher than that heating the central portion and reduce a temperature difference between the peripheral portion and the central portion so as to be smaller. With such regulation of heating powers, however, a resistivity of the peripheral portion of the silicon single crystal thin film 32 is deviated from that of the central portion thereof, a problem again arises, since a resistivity distribution along a diameter of the silicon single crystal thin film 32 becomes non-uniform.

In order to improve non-uniformity of a resistivity distribution along a diameter of a silicon single crystal thin film 32, it is only required that a flow rate of a dopant gas supplied onto a main surface of a silicon single crystal substrate 12 is varied and adjusted along a width direction of the reaction chamber 10.

However, since in the conventional horizontal, single wafer vapor phase growth apparatus shown in FIGS. 5 and 6, only a dopant gas of the same concentration is supplied into the reaction chamber 10 through a plurality of inlet ports 18a to 18f disposed in a width direction of the reaction chamber 10 and a concentration of the dopant gas cannot be changed in the width direction of the reaction chamber 10, therefore there can be performed no adjustment to alleviate non-uniformity of a resistivity distribution along a diameter of the silicon single crystal thin film 32.

In light of such circumstances, a trial was conducted that dopant gas flow rate regulating valves were provided at upstream sites from the respective inlet ports 18a to 18f to individually adjust a dopant gas flow rate at each inlet port 18a to 18f. However, according to this method, since a dopant flow rate is necessary to be adjusted at each inlet port 18a to 18f, a problem has arisen since actual adjustment of the dopant gas flow rates is very complex and non-realistic.

DISCLOSURE OF INVENTION

The invention has been made in light of the above described problems and it is accordingly an object of the invention to provide not only a semiconductor wafer obtained by forming a semiconductor thin film with uniform resistivity and virtually no slip dislocation therein on a main surface of a semiconductor single crystal substrate of a relatively low dopant concentration, as large as 300 mm or more in diameter but also a vapor phase growth apparatus by means of which a semiconductor thin film with uniform resistivity and substantially no slip dislocation therein can be formed on a main surface of a semiconductor single crystal substrate as large as 300 mm or more in diameter.

The above described task can be achieved by a semiconductor wafer relating to the invention and by means of a method for producing the semiconductor wafer.

That is, a semiconductor wafer relating to the invention is characterized by that the semiconductor wafer has a construction in which a semiconductor thin film with a resistivity distribution along a diameter within ±3%, both limits being included, is formed on a main surface of a semiconductor single crystal substrate of a dopant concentration ranging from $4\times10^{13}$ atoms/cm$^3$ to $3\times10^{18}$ atoms/cm$^3$, both limits being included, and a diameter ranging 300 mm to 400 mm, both limits being included.

In such a manner, a semiconductor wafer relating to the invention is constructed of a semiconductor single crystal substrate having a diameter as large as in the range of from 300 mm to 400 mm, both limits being included, of a dopant concentration as low as in the range of from $4\times10^{13}$ atoms/cm$^3$ to $3\times10^{18}$ atoms/cm$^3$, both limits being included and a semiconductor thin film with a resistivity distribution within ±3%, both limits being included, formed on a main surface of the semiconductor single crystal substrate with substantially no slip dislocation generated therein. Since, with a semiconductor wafer of the invention, requirements in terms of a large diameter and uniform resistivity on a recent semiconductor wafer are simultaneously achieved, use of the semiconductor wafer largely contributes to realization of increase in throughput and yield of semiconductor chip fabrication.

In a semiconductor wafer relating to the invention, it is preferable that a conductivity type of a semiconductor single crystal substrate is p and a resistivity thereof ranges from 0.03 Ω·cm to 300 Ω·cm, both limits being included. In this range of resistivity, a resistivity desirably ranges from 1 Ω·cm to 20 Ω·cm, both limits being included, from the viewpoint of actual fabrication of a semiconductor device using a semiconductor wafer. In this case, the use of boron as a dopant added to a semiconductor single crystal substrate is preferable in light of the practical aspects of handling in the use, easiness in controllability or the like needs.

In addition, in a semiconductor wafer relating to the invention, a diameter of a semiconductor single crystal substrate is preferably 300 mm in length. At the present stage, since a semiconductor single crystal substrate with a diameter up to 300 mm can be produced in a stable manner with high quality, in a case of a diameter as large as 300 mm, it is practically enjoyed to an full extent that a resistivity distribution of a semiconductor thin film along a diameter is achieved with uniformity of within ±3%, both limits being included, on a main surface of a semiconductor single crystal substrate whose dopant concentration ranges from $4\times10^{13}$ atoms/cm$^3$ to $3\times10^{18}$ atoms/cm$^3$, both limits being included.

Further, a semiconductor single crystal substrate is preferably a silicon single crystal substrate and a semiconductor thin film is preferably a silicon single crystal thin film. That is, a large diameter and a uniform resistivity are simultaneously achieved on a silicon single crystal wafer constituting the main stream of semiconductor wafers at the present time, and with this achievement, a semiconductor wafer of the invention is expected to find wide and various applications in semiconductor device fabrication.

Further, a vapor phase growth apparatus relating to the invention comprises a reaction chamber and a plurality of gas inlet ports disposed in a width direction of the reaction chamber, wherein a semiconductor raw material gas is supplied through the plurality of gas inlet ports onto a main surface of a semiconductor single crystal substrate rotating in the reaction chamber in one direction in almost parallel to the main surface thereof to grow a semiconductor thin film on the main surface thereof in vapor phase, and is characterized by that the vapor growth apparatus further comprises a main dopant gas pipe supplying a dopant gas to all of the plurality of gas inlet ports and an auxiliary dopant gas pipe supplying the dopant gas to a specific gas inlet port selected from the plurality of gas inlet ports. In such a manner, in a vapor phase growth apparatus relating to the invention, a main dopant gas pipe supplying a dopant gas to all of the plurality of gas inlet ports and an auxiliary dopant gas pipe supplying the dopant gas to a specific gas inlet port are simultaneously equipped. With such a construction, since it is possible that not only is the dopant gas supplied to a main surface of a semiconductor single crystal substrate in the reaction chamber through all of the gas inlet ports from the main dopant gas pipe to realize a vapor phase growth of a semiconductor thin film such that global resistivity of the thin film is controlled in the vicinity of a predetermined target value on the main surface of a semiconductor single crystal substrate, but the dopant gas is additionally supplied to the main surface of the semiconductor single crystal substrate in the reaction chamber through the specific gas inlet port from the auxiliary dopant gas pipe to adjust a resistivity distribution of a semiconductor thin film, therefore even when the semiconductor thin film is formed on the main surface of a large diameter semiconductor single crystal substrate, a uniform resistivity across the semiconductor thin film is ensured.

For example, a resistivity distribution along a diameter of a semiconductor thin film formed on a main surface of a semiconductor single crystal substrate with a diameter as large as in the range of from 300 mm to 400 mm, both limits being included, and a dopant concentration as low as in the range of from $4\times10^{13}$ atoms/cm$^3$ to $3\times10^{18}$ atoms/cm$^3$, both limits being included, can be within ±3%, both limits being included.

Further, after supplying conditions for a dopant gas supplied through the main and auxiliary dopant gas pipes are adjusted such that a resistivity distribution along a diameter of a semiconductor thin film is uniform within, for example, ±3%, both limits being included, even when a target resistivity of a semiconductor thin film becomes necessary to be altered higher or lower, a supply rate of hydrogen gas diluting the dopant gas is controlled while a ratio in flow rate of the dopant gas supplied through the main and auxiliary dopant gas pipes is retained and thereby, a change in target resistivity can be realized while uniformity of a resistivity distribution is maintained. Therefore, alteration of a target resistivity of a semiconductor thin film can be effected with ease and speediness, thereby achieving improved productivity.

Further, in a vapor phase growth apparatus relating to the invention, it is preferable that a plurality of gas inlet ports are grouped into three kinds of inlet ports: inner inlet ports disposed at the innermost side in a width direction of a reaction chamber, outer inlet ports disposed at the outermost side in the width direction of the reaction chamber and middle inlet ports each between one of the two inner inlet ports and the corresponding one of the two outer inlet ports, and a specific gas inlet port through which a dopant gas is supplied into the reaction chamber from an auxiliary dopant gas pipe is one or two kinds selected from the group consisting of the inner inlet ports, the outer inlet ports and the middle inlet ports.

In such a manner, in a vapor phase growth apparatus relating to the invention, a plurality of gas inlet ports are grouped into three kinds of inlets including the inner inlet ports, the outer inlet ports and the middle inlet ports and a specific gas inlet port through which a dopant gas is supplied into the reaction chamber from an auxiliary dopant gas pipe is one or two kinds selected from the group consisting of the inner inlet ports, the outer inlet ports and the middle inlet ports. With such a construction, the dopant gas can be supplied through the inner inlet port only, through the outer inlet ports only or through the middle inlet port only, or through the inner inlet ports and the middle inlet ports combined or through the middle inlet ports and the outer inlet ports combined.

That is, on one hand, a dopant gas supplied through the gas inlet ports of three kinds including the inner inlet ports, the outer inlet ports and the middle inlet ports into the reaction chamber from the main dopant gas pipe is directed toward points in the vicinity of the center of a main surface of a semiconductor single crystal substrate from the inner gas inlet ports, toward points in the vicinity of the outer periphery of the semiconductor single crystal substrate from the outer gas inlet ports and toward points between the central portion and the outer peripheral portion of the main surface of the semiconductor single crystal substrate from the middle gas inlet ports, on an imaginary central axis passing through the center of the main surface of the semiconductor single crystal substrate in a width direction of the reaction chamber, while on the other hand, the dopant gas can be additionally supplied into the reaction chamber from an auxiliary dopant gas pipe through a specific gas inlet port corresponding to a local region with high resistivity of a semiconductor thin film grown in vapor phase on the main surface of the semiconductor single crystal substrate, the specific gas inlet being one or two kinds selected from the group consisting of the inner inlet ports, the outer inlet ports and the middle inlet ports.

In such a manner, a dopant gas supplied all over a main surface of a semiconductor single crystal substrate through all of the gas inlet ports of the three kinds from a main dopant gas pipe and the dopant gas supplied locally to the main surface of the semiconductor single crystal substrate into the reaction chamber through a specific gas inlet port of one or two kinds selected from the group consisting of the inner inlet ports, the outer inlet ports and the middle inlet ports from an auxiliary dopant gas pipe are combined so as to make uniform resistivity of a semiconductor thin film formed on the main surface of a semiconductor single crystal substrate.

It should be noted that while description is made of the case where a plurality of gas inlet ports disposed in a width direction of the reaction chamber include the three kinds of the inner inlet ports, the outer inlet ports and the middle inlet ports, gas inlet ports of more than three kinds can be equipped according to a level of development in large diameter of a semiconductor single crystal substrate. In that case, a specific gas inlet port through which a dopant gas is supplied into the reaction chamber from an auxiliary dopant gas pipe may be any one kind selected from more than three kinds of gas inlet ports or any combination of two or more kinds selected from the more than three kinds of gas inlet ports.

Further, in a vapor phase growth apparatus relating to the invention, it is more preferable that the main dopant gas pipe and the auxiliary dopant gas pipe are equipped with respective dopant gas flow rate regulators regulating supply of the dopant gas.

In such a manner, in a vapor phase growth apparatus relating to the invention, the main dopant gas pipe and the auxiliary dopant gas pipe are equipped with respective dopant gas flow rate regulators regulating supply of the dopant gas. With this construction, since it is possible that not only is a dopant gas supplied all over a main surface of a semiconductor single crystal substrate in the reaction chamber through all of the gas inlet ports from the main dopant gas pipe and the dopant gas is additionally supplied locally onto the main surface of the semiconductor single crystal substrate through the specific gas inlet port from the auxiliary dopant gas pipe are separately controlled to adjust a resistivity distribution of a semiconductor thin film to high precision, therefore even when the semiconductor thin film is formed on the main surface of a large diameter semiconductor single crystal substrate, a more uniform resistivity distribution along a diameter of the semiconductor thin film is achieved.

It should be noted that in a case where an auxiliary dopant gas pipe is constructed of two kinds of dopant gas pipes, the dopant gas pipes are desirably equipped with respective dopant gas flow rate regulators. With such provision of the regulators, a resistivity distribution along a diameter of a semiconductor thin film becomes more uniform.

Further, a vapor phase growth apparatus relating to the invention in the above described example is preferably a cold-wall vapor phase apparatus. In this case, since the outer wall surface of the reactor chamber is forcibly cooled by a coolant, deposits to be attached on the inner wall surface of a reaction chamber in vapor phase growth is prevented from occurring, thereby forming a higher quality semiconductor thin film.

EMBODIMENTS OF INVENTION

Description will be made of an embodiment of the present invention below with reference to the accompanying drawings.

Figure 1:
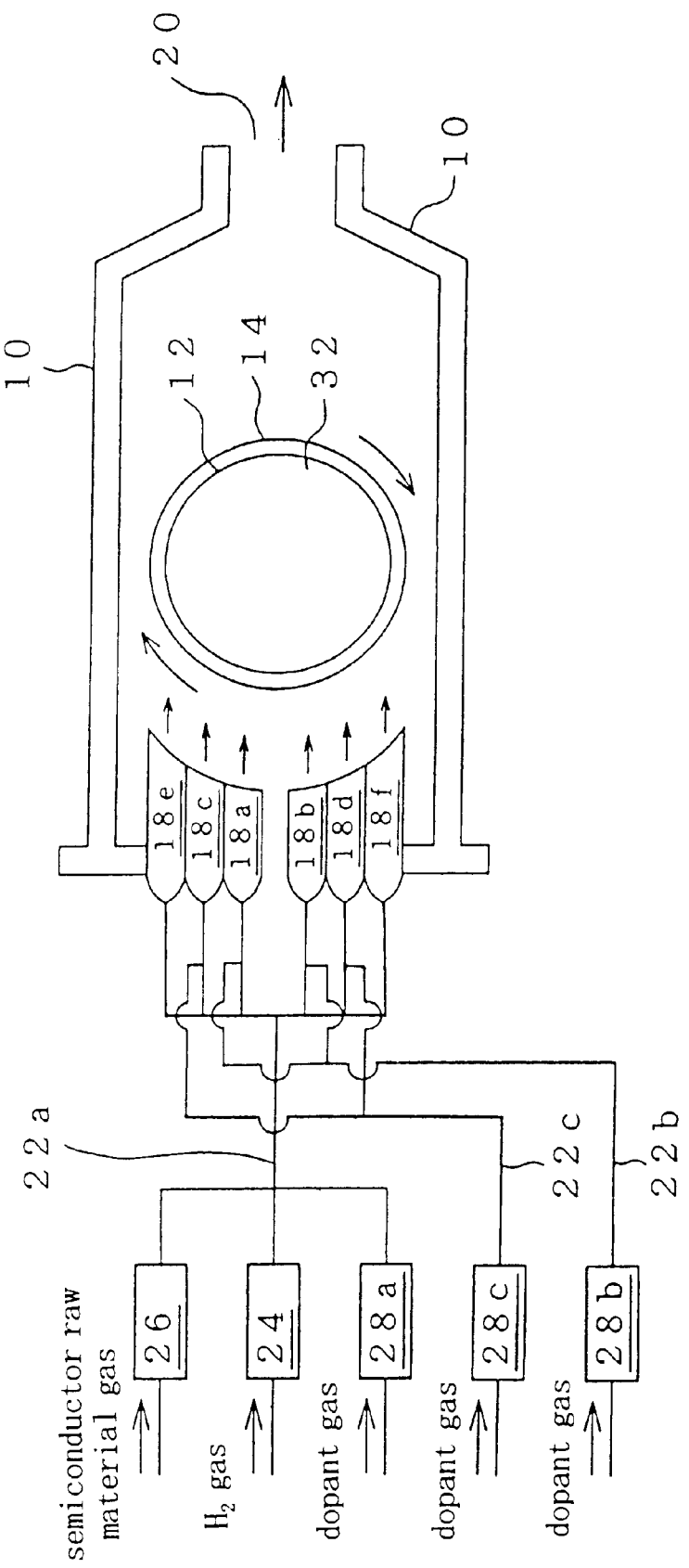
FIG. 1 is a sectional view in a horizontal plane showing a horizontal, single wafer vapor phase growth apparatus used in a method for producing a semiconductor wafer in a simplified manner, relating to an embodiment of the invention.
Figure 5:
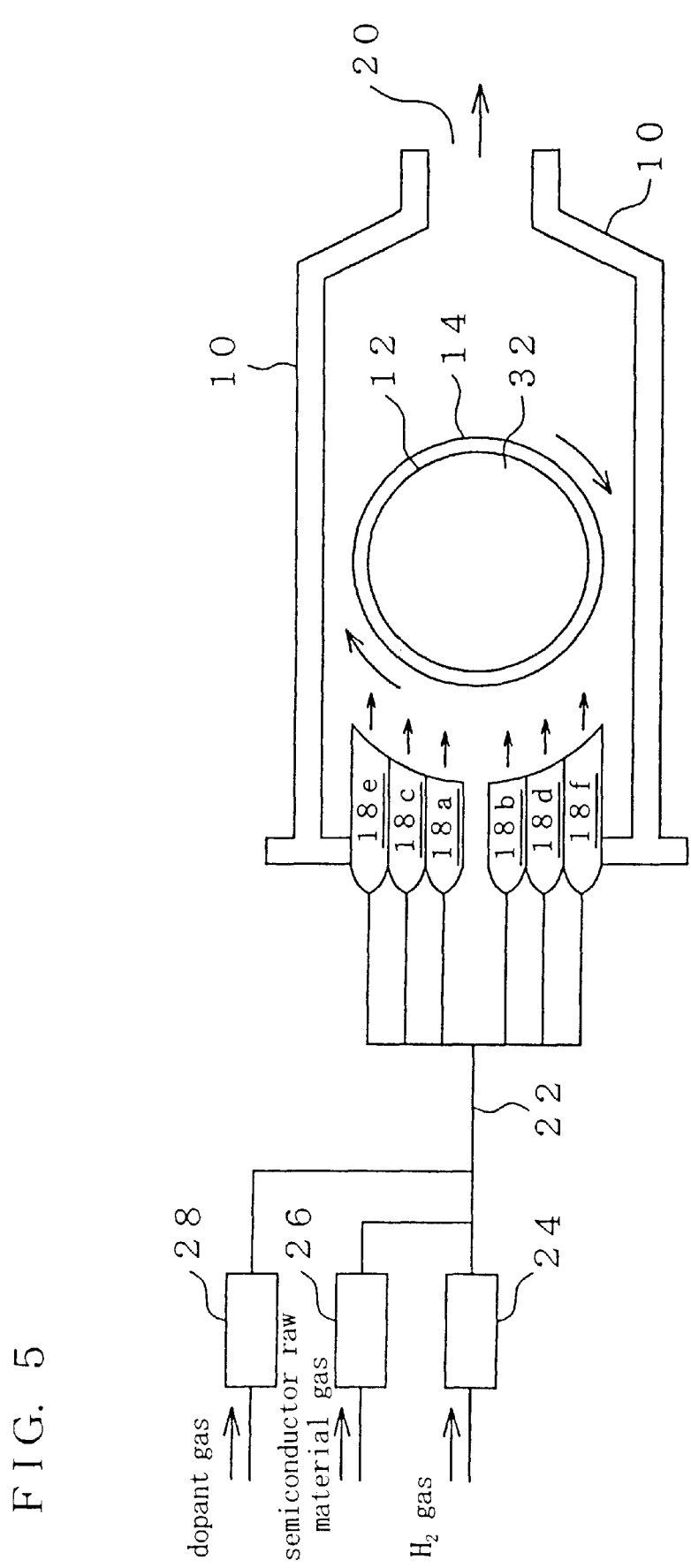
FIG. 5 is a sectional view in a horizontal plane showing a conventional horizontal, single wafer vapor phase growth apparatus used in a conventional method for producing a semiconductor wafer in a simplified manner.
Figure 6:
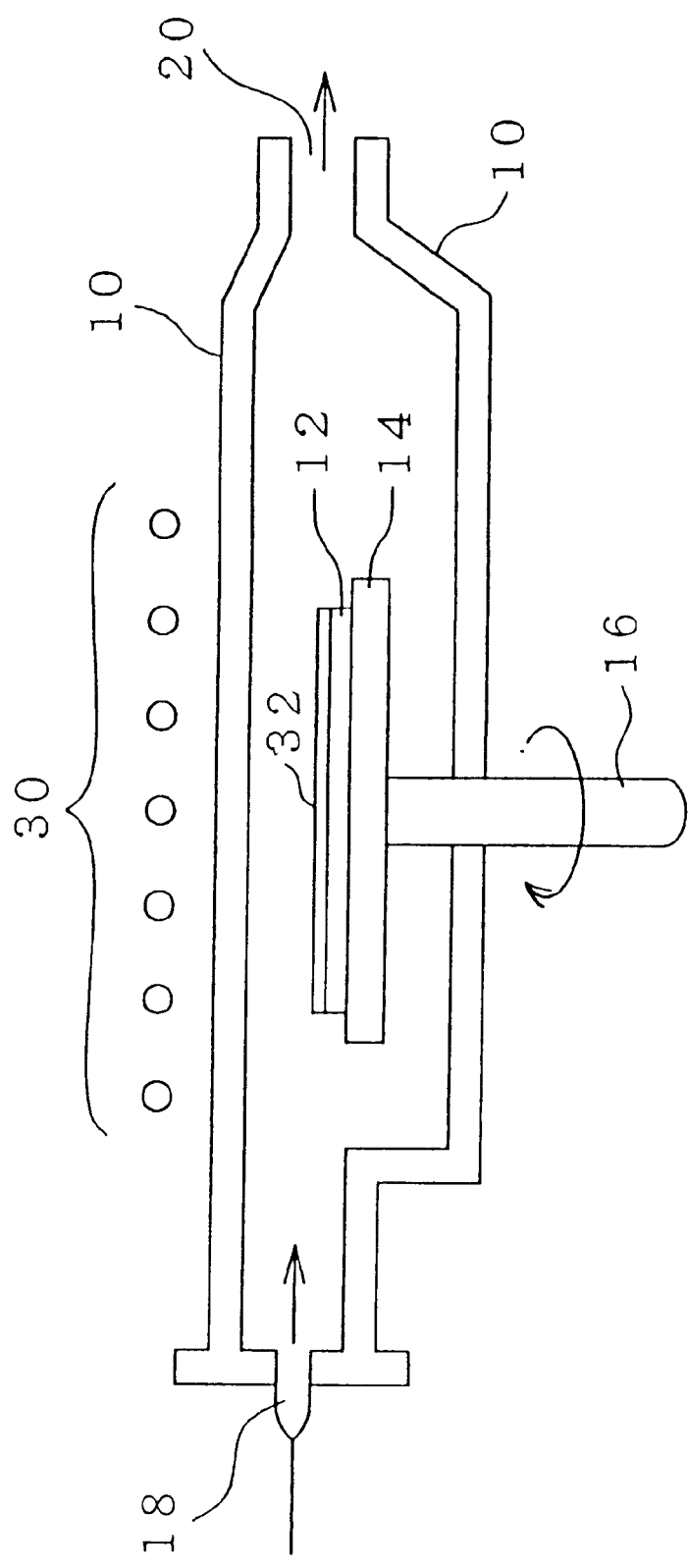
FIG. 6 is a sectional view in a vertical plane showing a conventional horizontal, single wafer vapor phase growth apparatus used in a method for producing a semiconductor wafer in a simplified manner.

FIG. 1 is a sectional view in a horizontal plane showing a horizontal, single wafer vapor phase growth apparatus used in a method for producing a semiconductor wafer in a simplified manner, relating to an embodiment of the invention. It should be noted that since a sectional view in a vertical plane showing the horizontal, single wafer vapor phase growth apparatus used in a method for producing a semiconductor wafer in a simplified manner, relating to an embodiment of the invention is basically similar to FIG. 6, therefore FIG. 6 is used in description thereof and the sectional view in a vertical plane of the horizontal, single wafer vapor phase growth apparatus is not shown. Further, in FIG. 1, the same constituents as those of the conventional horizontal, single wafer vapor phase growth apparatus in FIGS. 5 and 6 are represented by the same marks as those corresponding in FIGS. 5 and 6 and descriptions thereof are omitted or simplified.

As shown in FIGS. 1 and 6, in a horizontal, single wafer vapor phase growth apparatus used in a method for producing semiconductor wafer, relating to this embodiment, a susceptor 14 on which a silicon single crystal substrate 12 is horizontally placed is disposed at the bottom of the middle portion of a transparent quartz glass reaction chamber 10 installed along a horizontal direction and the susceptor 14 is coupled with a rotation device (not shown) through a rotary shaft 16.

Further, a gas inlet port 18 is provided at one end in a length direction of the reaction chamber 10 and a gas outlet port 20 is provided at the other end thereof. With this construction, a flow of a gas which is introduced through the gas inlet port 18 and discharged through the gas outlet port 20 to the outside passes over a main surface of the silicon single crystal substrate 12 placed on the susceptor 14 along a length direction of the reaction chamber 10.

Further, the gas inlet port 18 of the reaction chamber 10 is constructed of six inlet ports 18a to 18f spread in a width direction of the reaction chamber 10. Among the six inlet ports 18a to 18f, inner inlet ports 18a and 18b, outer inlet ports 18e and 18f and middle inlet ports 18c and 18d are arranged in symmetry with respect to an imaginary central axis along the length direction of the reaction chamber 10 passing through the center of the main surface of the silicon single crystal substrate 12 on the susceptor 14.

To be more detailed, the inner inlet ports 18a and 18b are directed toward points in the vicinity of the center of the main surface of the silicon single crystal substrate 12 on an imaginary central axis along a width direction of the reaction chamber 10 passing through the center of the main surface of the silicon single crystal substrate 12 on the susceptor 14, and the outer inlet ports 18e and 18f are directed toward points in the vicinity of the outer periphery of the main surface of the silicon single crystal substrate 12 on the imaginary central axis line and the middle inlet ports 18c and 18d are directed toward points between the central portion and the outer peripheral portion of the main surface of the silicon single crystal substrate 12 on the imaginary central axis line.

Further, the six inlet ports 18a to 18f are all connected to a common gas pipe 22a. The common gas pipe 22a are branched in three ways and the branches are connected to a gas source (not shown) of hydrogen ($H_2$) gas as a carrier gas, a gas source (not shown) of a semiconductor raw material gas and a gas source (not shown) of a dopant gas through MFC 24, 26 and 28a, respectively, as gas flow rate regulators.

In such a manner, the six inlet ports 18a to 18f are connected to the gas source of the dopant gas through the common gas pipe 22a and MFC 28a. With this construction, the common gas pipe 22a functions as a main dopant gas pipe supplying the dopant gas to all of the six inlet ports 18a to 18f.

Further, the inner inlet ports 18a and 18b are both connected to a first auxiliary dopant gas pipe 22b. The first auxiliary dopant gas pipe 22b is connected to a gas source (not shown) of the dopant gas through MFC 28b as a dopant gas flow rate regulator.

Likewise, the middle inlet ports 18c and 18d are both connected to a second auxiliary dopant gas pipe 22c. The second auxiliary dopant gas pipe 22c is connected to a gas source (not shown) of the dopant gas through MFC 28c as a dopant gas flow rate regulator.

It should be here noted that as a semiconductor raw material gas, there is employed, for example, Si-containing gas, such as $SiCl_4$ (tetrachlorosilane) gas, $SiH_2Cl_2$ (dichlorosilane) gas, $SiHCl_3$ (trichlorosilane) gas or $SiH_4$ (monosilane) gas, while as a dopant gas, there is employed, for example, $B_2H_6$ (diborane) gas, $PH_3$ (phosphine) gas or the like gases.

Further, outside of the reaction chamber 10, there is disposed an infrared radiation lamp 30, for example, as a heat source heating the silicon single crystal substrate 12 placed horizontally on the susceptor 14 to raise a temperature of the main surface of the silicon single crystal substrate 12 to a predetermined value. In addition, cooling means (not shown) for cooling the infrared radiation lamp 30 and an outer wall of the reaction chamber 10 is equipped and thus, a cold-wall vapor phase growth apparatus is constituted.

Then, description will be made of a method for forming a silicon single crystal thin film with substantially no slip dislocation therein and uniform resistivity thereacross on a main surface of a silicon single crystal substrate 12 as large as 300 mm or more in diameter, with a relative low dopant concentration using the horizontal, single wafer vapor phase growth apparatus shown in FIGS. 1 and 6.

First, a silicon single crystal substrate 12 as large as in the range of from 300 mm to 400 mm, both limits being included, in diameter, with a dopant concentration as low as in the range of from $4\times10^{13}$ atoms/$cm^3$ to $3\times10^{18}$ atoms/$cm^3$, both limits being included, is horizontally placed on the susceptor 14 in the reaction chamber 10.

It should be noted that while even if a dopant concentration is as low as less than $4\times10^{13}$ atoms/$cm^3$, no specific problem arises, such a dopant concentration is not actually adopted, and therefore, a dopant concentration in this range is not practical. On the other hand, if a dopant concentration is as high as more than $3\times10^{18}$ atoms/$cm^3$, reduction in resistivity in a peripheral portion of a silicon single crystal thin film formed on a main surface of a silicon single crystal substrate 12 cannot be neglected under influence of an auto-doping phenomenon, thereby making it difficult to achieve a resistivity distribution along a diameter within ±3% or less.

Further, in a case of a conductivity type of the silicon single crystal substrate 12 is p, a dopant concentration range of from $4\times10^{13}$ atoms/$cm^3$ to $3\times10^{18}$ atoms/$cm^3$ both limits being included, is converted approximately to a resistivity range of from 0.03 Ω·cm to 300 Ω·cm.

Following the placement of the silicon single crystal substrate 12 on the susceptor 14, $H_2$ gas is supplied into the reaction chamber 10 from a gas source of $H_2$ gas through MFC 24, the common gas pipe 22a and the six inlet ports 18a to 18f to substitute for an atmosphere in the reaction chamber 10. Further, the susceptor 14 is clockwise rotated as shown by arrow marks in FIGS. 1 and 6 by the rotation unit through the rotary shaft 16 with the silicon single crystal substrate 12 being kept horizontally on the susceptor 14. With the infrared radiation lamp 30, heating is effected on the silicon single crystal substrate 12 on the susceptor 14 according to a predetermined temperature programme to raise a temperature at a main surface thereof to a predetermined set temperature.

At this point, in order to prevent generation of slip dislocation in the next vapor phase growth step, a heating power distribution from the infrared radiation lamp 30 is adjusted in advance. That is, in a cold-wall vapor phase growth apparatus, since the outer wall surface of the reaction chamber 10 is forcibly cooled by a coolant, heat energy is easier to be dissipated from an peripheral portion of the silicon single crystal substrate 12 close to the wall surface under influence of forced cooling of the wall surface. For this reason, the peripheral portion of the silicon single crystal substrate 12 is heated more intensely than the central portion thereof so as to prevent a temperature difference between the peripheral portion and the central portion from being large, with the result that a temperature distribution is adjusted in advance in which no slip dislocation is generated in a silicon single crystal thin film formed on the main surface of the silicon single crystal substrate 12.

However, in this case, it should be noted that there arises a tendency that if a conductivity type of the silicon single crystal thin film grown in vapor phase on the main surface of the silicon single crystal substrate 12 is p, a resistivity in the peripheral portion of the silicon single crystal thin film is lower than that in the central portion thereof, while contrary to this, if a conductivity type of the silicon single crystal thin film is n, a resistivity in the peripheral portion of the silicon single crystal thin film is higher than that in the central portion thereof.

Following the heating power adjustment, a main surface temperature of the silicon single crystal substrate 12 is controlled according to the predetermined temperature programme and in the vapor phase growth step, not only is a semiconductor raw material gas is supplied into the reaction chamber 10 from a gas source of the semiconductor raw material gas through MFC 26, the common gas pipe 22a and the six inlet ports 18a to 18f, but a dopant gas is also supplied into the reaction chamber 10 from a gas source of the dopant gas through MFC 28a, 28b and 28c, the common gas pipe 22a, the first auxiliary dopant gas pipe 22b, the second auxiliary dopant gas pipe 22c and the six inlet ports 18a to 18f.

At this time, the dopant gas is supplied into the reaction chamber 10 through the six inlet ports 18a to 18f from the common gas pipe 22a functioning as a main dopant gas pipe. Further, the dopant gas is additionally supplied through the inner inlet ports 18a and 18b from the first auxiliary dopant gas pipe 22b. In addition to this, the dopant gas is also additionally supplied into the reaction chamber 10 through the middle inlet ports 18c and 18d from the second auxiliary dopant gas pipe 22c.

With such a construction, a basic reference resistivity value of silicon single crystal thin film grown in vapor phase on a main surface of the silicon single crystal substrate 12 is almost realized by adjusting mainly a dopant gas concentration of the dopant gas supplied through the six inlet ports 18a to 18f from the common gas pipe 22a functioning as the main dopant gas pipe.

Further, dopant gas concentrations of the dopant gas additionally supplied through the inner inlet ports 18a and 18b and the middle inlet ports 18c and 18d as specific inlet ports from the first auxiliary dopant gas pipe 22b and the second auxiliary dopant gas pipe 22c, respectively, are individually adjusted to achieve almost uniform resistivity distribution across the silicon single crystal thin film.

Further, at this time, flow rates of $H_2$ gas as carrier gas and a semiconductor raw material gas are separately controlled by MFC 24 and MFC 26, respectively, to a precision. On the other hand, a flow rate of the dopant gas supplied from the common gas pipe 22a functioning as the main dopant gas pipe is precisely controlled by MFC 28a and likewise, flow rates of the dopant gas supplied additionally from the first and second auxiliary dopant gas pipes 22b and 22c are separately controlled by MFC 28b and MFC 28c to a precision.

The dopant gas flows controlled with MFC 28a, 28b and 28c, respectively, to a precision are mixed and introduced into the reaction chamber 10 with almost no diffusion in a width direction through the six inlet ports 18a to 18f disposed in a width direction of the reaction chamber 10.

In the vapor phase growth apparatus shown in FIG. 1, a process gas introduced into the reaction chamber 10 passes over the main surface of the silicon single crystal substrate 12 placed on the susceptor 14 rotating about the rotary shaft 16 as a center in one direction and in almost parallel to the main surface thereof.

At this point, dopant gas flows through the inner inlet ports 18a and 18b, and the middle inlet ports 18c and 18d have respective higher concentrations of the dopant gas by additional supplies from the first and second auxiliary dopant gas pipes 22b and 22c than that of a dopant gas flow through the outer inlet ports 18e and 18f. In this situation, a chemical reaction arises and a silicon single crystal thin film 32 is grown in vapor phase on the main surface of the silicon single crystal substrate 12.

EXAMPLE

Description will be made, using FIGS. 2 and 3, of concrete operating conditions for formation of a silicon single crystal thin film on a main surface of silicon single crystal substrate using the horizontal, single wafer vapor phase growth apparatus shown in FIGS. 1 and 6, and a resistivity distribution of a silicon single crystal thin film 32 thus formed under the concrete operating conditions.

Figure 2:
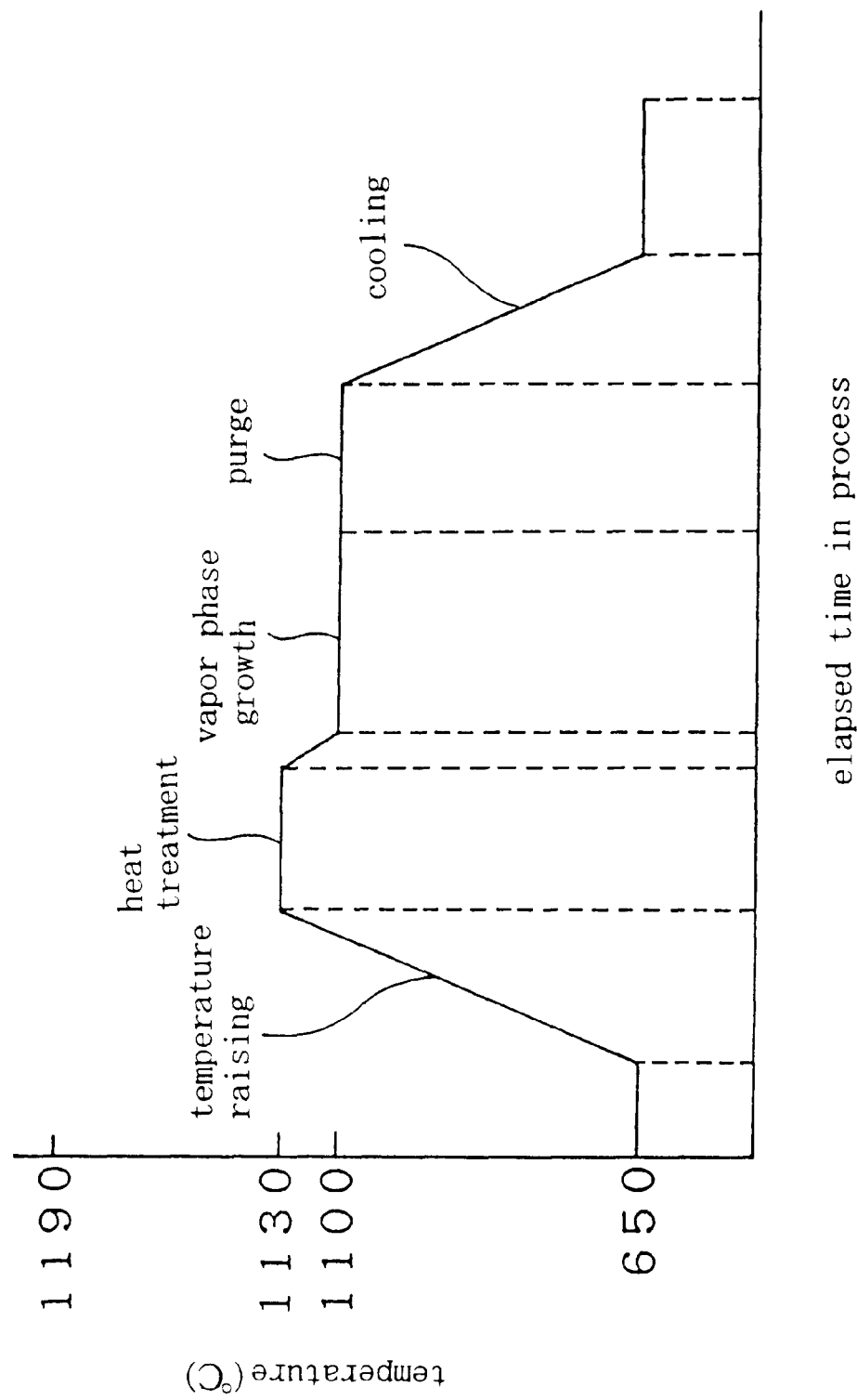
FIG. 2 is a graph showing a temperature programme in production of a semiconductor wafer using the vapor phase growth apparatus of FIG. 1.
Figure 3:
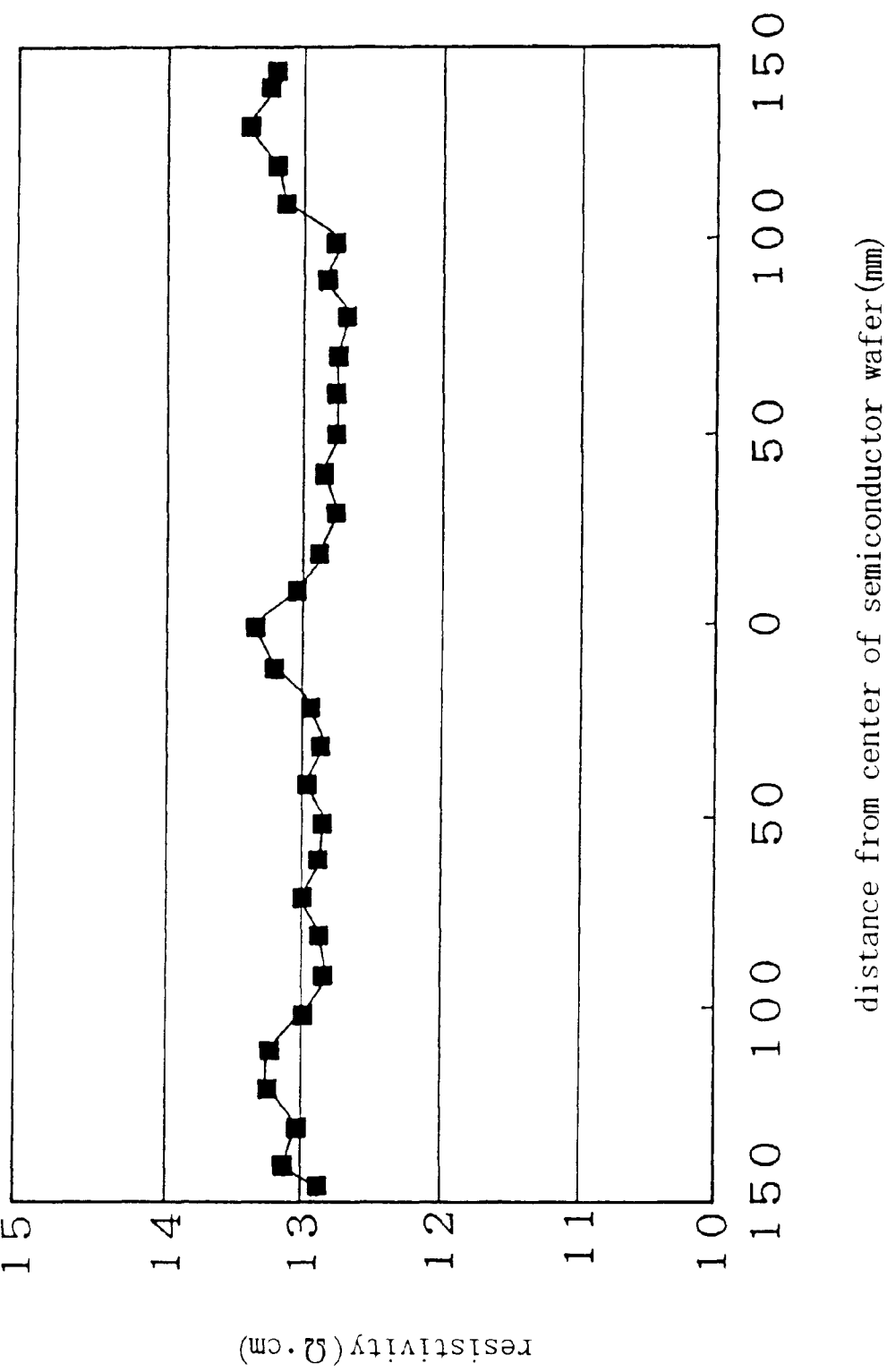
FIG. 3 is a graph showing a resistivity distribution along a diameter of a semiconductor wafer produced using the vapor phase growth apparatus of FIG. 1.

FIG. 2 is a graph showing a temperature programme in production of a semiconductor wafer using the vapor phase growth apparatus shown in FIG. 1 and FIG. 3 is a graph showing a resistivity distribution along a diameter of a semiconductor wafer produced using the vapor phase growth apparatus of FIG. 1. As the silicon single crystal substrate 12 placed on the susceptor 14 in the reaction chamber 10, there is used a p-type silicon single crystal substrate 12 of 300 mm±0.2 mm in diameter and of a resistivity in the range of from 1 Ω·cm to 20 Ω·cm, both limits being included, (as a converted dopant concentration, ranging from $6 \times 10^{14}$ atoms/cm³ to $2 \times 10^{16}$ atoms/cm³, both limits being included) in which boron is doped at a relatively low concentration at which no consideration is necessary on an auto-doping phenomenon due to the doped boron.

After the silicon single crystal substrate 12 is horizontally placed on the susceptor 14 in the reaction chamber 14, $H_2$ gas is supplied into the reaction chamber 10 through the six inlet ports 18a to 18f to achieve a $H_2$ atmosphere in the reaction chamber 10. Further, the susceptor 14 is rotated by a rotation unit, for example, clockwise while keeping the silicon single crystal substrate 12 horizontally on the susceptor 14.

In the $H_2$ atmosphere, the infrared radiation lamp 30 as a heat source is supplied with electricity to heat the silicon single crystal substrate 12 on the susceptor 14 and raise a temperature of the main surface of the silicon single crystal substrate 12 to 1130° C. according to the temperature programme of FIG. 2 (a temperature raising step). Thereafter, the temperature is kept at 1130° C. for a time to perform a heat treatment for removing a natural oxide film formed on the main surface of the silicon single crystal substrate 12 (a heat-treatment step).

It should be noted, at this time, that conditions for the heat treatment are obtained in advance such that no slip dislocation is generated in the silicon single crystal thin film formed on the main surface of the silicon single crystal substrate 12 and the heat treatment is performed according to the conditions. For example, in this example, about 60% of a total heating power is allocated in the vicinity of the periphery of the silicon single crystal substrate 12, while about 40% thereof is allocated in the vicinity of the center.

After the heat treatment, the temperature of the main surface of the silicon single crystal substrate 12 is lowered to 1100° C. from 1130° C. and subsequent to this change in temperature, the process gas composed of $H_2$ gas as a carrier gas, the semiconductor raw material gas and the dopant gas is supplied into the reaction chamber 10 through the six inlet ports 18a to 18f.

At this time, a flow rate of $H_2$ gas as a carrier gas is precisely controlled with MFC 24 at 70 l/min and supplied into the reaction chamber 10 through all of the six inlet ports 18a to 18f in a uniform manner. Further, as a semiconductor raw material gas, for example, a mixed gas obtained by bubbling hydrogen in liquid $SiHCl_3$ is used and this mixed gas supplied from a common semiconductor raw material source is precisely controlled with MFC 26 at a flow rate of 22 l/min and supplied into the reaction chamber 10 through all of the six inlet ports 18a to 18f in a uniform manner.

Further, as a common dopant gas source, for example, $B_2H_6$ gas diluted with hydrogen is used and the $B_2H_6$ gas diluted with hydrogen is supplied into the reaction chamber 10 through all of the six inlet ports 18a to 18f at 90 cm³/min from the common gas pipe 22a functioning as the main dopant gas pipe. Simultaneously to this, the $B_2H_6$ gas diluted with hydrogen is supplied into the reaction chamber 10 not only through the inner inlet ports 18a and 18b at a flow rate of 4 cm³/min from the first auxiliary dopant gas pipe 22b, but also through the middle inlet ports 18c and 18d at a flow rate of 40 cm³/min from the second auxiliary dopant gas pipe 22c.

The dopant gas flows from the common gas pipe 22a functioning as the main dopant gas pipe 22a, and the first and second auxiliary dopant gas pipes 22b and 22c are individually controlled precisely by MFC 28a, 28b and 28c, respectively. In such a manner, a chemical reaction occurs in the process gas supplied into the reaction chamber 10 and a p-type silicon single crystal thin film 32 with a target resistivity values of 13 Ω·cm and a target resistivity distribution within ±3%, both limits being included, is grown in vapor phase on a main surface of a silicon single crystal substrate 12 to a thickness of 4 µm (a vapor phase growth step).

After the vapor phase growth, the inside of the reaction chamber 10 is sufficiently purged with H₂ gas (a purge step). Then, power supply to the infrared radiation lamp 30 as a heat source is cut and the semiconductor wafer obtained by forming the semiconductor single crystal thin film 32 on the main surface of the silicon single crystal substrate 12 is cooled down to 650° C. (a cooling step). Thereafter, the semiconductor wafer is taken out from the reaction chamber 10.

Then, the silicon single crystal thin film 32 thus formed on the main surface of the silicon single crystal substrate 12 is measured on a resistivity thereof.

A SCP (Surface Charge Profiler) device of a QC Solutions CO. located at Woburn, Mass., USA was employed in measurement of the resistivity. This SCP device adopts a SPV (surface photo voltage) method as a measurement principle described below. That is, first, a sample wafer is heated at about 300° C. for a short time such that a electric charge in a natural oxide film formed on a surface of the sample wafer becomes constant and the sample wafer surface is then illuminated with light of 450 nm in a wavelength emitted from a GaN (Gallium nitride) LED (Light Emitting Diode) in pulses of about 40 Hz in frequency.

Minority carriers excited by the incident light at a penetration depth of about 0.4 µm causes a change in potential at the sample wafer surface and this potential change is sensed as an SPV signal. Since the SPV signal is proportional to a width of a depletion layer and the width is in turn proportional to an impurity concentration in silicon of the sample wafer, an impurity concentration at a depth of about 1 µm from the sample wafer surface is sensed and the sensed value is converted into a resistivity value.

With the SCP device, a resistivity distribution along a diameter of a silicon single crystal thin film 32 formed on a main surface of a silicon single crystal substrate 12 was measured at spatial intervals of 10 mm and a result as shown in a graph of FIG. 3 was obtained.

Comparative Example

Then, in order to conduct comparison with the result of the example, description will be made of a resistivity distribution of a silicon single crystal thin film formed on a main surface of a silicon single crystal substrate using a conventional horizontal, single wafer vapor phase growth apparatus with reference to FIG. 4.

Figure 4:
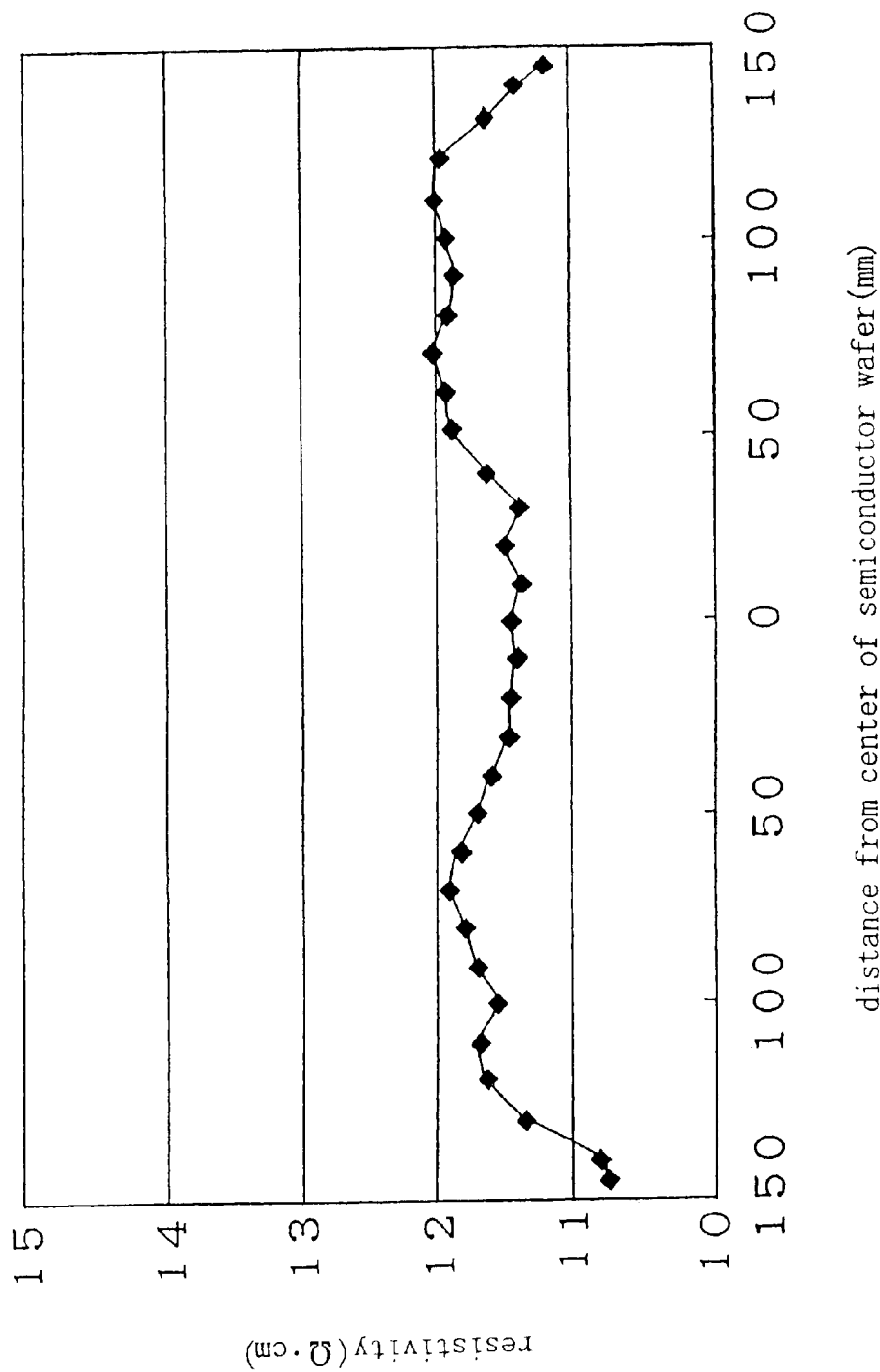
FIG. 4 is a graph showing a resistivity distribution along a diameter of a semiconductor wafer produced using a conventional vapor phase growth apparatus.

FIG. 4 is a graph showing a resistivity distribution along a diameter of a semiconductor wafer produced using a conventional vapor phase growth apparatus shown in FIG. 5.

In the comparative example, B₂H₆ gas diluted with hydrogen is used as a dopant gas and the B₂H₆ gas diluted with hydrogen is supplied into the reaction chamber 10 at a flow rate of 160 cm³/min through each of all the inlet ports 18a to 18f in a uniform manner and vapor phase growth is effected at a temperature of 1130° C. The other conditions are the same as those of the above described example, such as a size, a resistivity of a silicon single crystal substrate 12 in use, kinds and flow rates of a carrier gas and a semiconductor raw material gas, conditions of a temperature programme including a temperature raising step, a heat treatment step, a vapor phase growth step, a purge step and cooling step, and resistivity measurement conditions for a silicon single crystal thin film 32.

A silicon single crystal thin film 32 was formed on a main surface of a silicon single crystal substrate 12 using a conventional vapor phase growth apparatus in the above described conditions and a resistivity distribution of the silicon single crystal thin film 32 was measured at spatial intervals of 10 mm along a diameter and a result as shown in a graph of FIG. 4 was obtained. Then, comparison is conducted on the results shown in the graphs of FIG. 3 of the example and of FIG. 4 of the comparative example with each other.

First, when comparing the graphs of FIGS. 3 and 4 directly with each other, it is clear that, although reduction in resistivity was observed in the vicinity of each of the outer peripheries of silicon single crystal thin films 32 in both cases, a reduction in resistivity was not observed in the example, but in the comparative example.

The reason is that since the silicon single crystal thin film 32 in the comparative example was heated more intensely in the vicinity of the outer periphery thereof than in the vicinity of the center thereof, an incorporation ratio of boron supplied in gas phase as a p-type dopant into the silicon single crystal thin film 32 was higher in the vicinity of the outer periphery thereof and, accordingly, a resistivity was reduced there, while since in the example, a dopant amount corresponding to the reduction in resistivity in the vicinity of the outer periphery was additionally supplied in the vicinity of the center through the first and second auxiliary dopant gas pipes 22b and 22c, no reduction in resistivity in the vicinity of the outer periphery of the silicon single crystal thin film 32 was observed compared with that in the vicinity of the center.

Further, between the graphs of FIGS. 3 and 4, comparison in terms of a numerical value goes as follows: that is, in the above example, as shown in FIG. 3, an average resistivity value over all measurement points of the silicon single crystal thin film 32 is 12.97 Ω·cm, which is very close to a target resistivity value of 13 Ω·cm. Further, when calculating a resistivity distribution of the silicon single crystal thin film 32 using the following formula:

(Maximum resistivity−Minimum resistivity)/(Maximum resistivity+Minimum resistivity)　　(1), the maximum resistivity and the minimum resistivity of the silicon single crystal thin film 32 are 13.38 Ω·cm and 12.68 Ω·cm, respectively, and thereby, a resistivity distribution in this case is within ±2.69% and is satisfactorily within the target resistivity distribution of ±3.0% or less.

In the mean time, when calculating a resistivity distribution of the silicon single crystal thin film 32 using the following formula instead of the formula (1):

(Maximum resistivity−Minimum resistivity)/average resistivity over all measurement points　　(2), the resistivity distribution is 5.4%.

On the other hand, in the comparative example, as shown in FIG. 4, an average resistivity over all measurement points of the silicon single crystal thin film 32 is 11.62 Ω·cm. Further, the maximum resistivity and the minimum resistivity of the silicon single crystal thin film 32 are 12.02 Ω·cm and 10.77 Ω·cm, respectively, and therefore, a resistivity distribution in the comparative example is ±5.48%, which exceeds the target value of ±3.0%. It should be noted that, when calculating using the formula (2), a resistivity distribution in this case is 10.8%.

As described above, from the comparison of the example and the comparative example with each other, even when a silicon single crystal thin film 32 was grown in vapor phase on a main surface of a silicon single crystal substrate 12 as large as 300 mm±0.2 mm in diameter, it was recognized that uniformity of a resistivity distribution along a diameter of the silicon single crystal thin film 32 was able to be sufficiently improved compared with a conventional practice.

It should be noted that it was cleared that when the inventor repeated experiments changing various conditions including ones other than the conditions in consideration in the above described example, resistivity distributions of silicon single crystal thin films 32 fluctuated more or less according to concentrations of a semiconductor raw material gas and a dopant gas supplied into the reaction chamber 10 and a reaction temperature. However, if a method for producing a semiconductor wafer relating to the above described embodiment is applied, when a silicon single crystal thin film 32 is grown in vapor phase on a main surface of a lightly doped silicon single crystal substrate 12 of 300 mm in diameter, then a resistivity distribution of the silicon single crystal thin film 32 can be easily controlled within ±3.0% or less (in the case of the formula (1)) or 6% or less (in the case of the formula (2)).

Even if a diameter of a silicon single crystal substrate 12 ranges from 300 mm to 400 mm, both limits being included, similar to the above, a resistivity distribution of the silicon single crystal thin film 32 grown in vapor phase on a main surface of the silicon single crystal substrate 12 can be easily controlled within ±3.0% or less (in the case of the formula (1)) or 6% or less (in the case of the formula (2)). To be described further, while in a case where a diameter of a silicon single crystal substrate 12 exceeds 400 mm, the silicon single crystal substrate 12 with sufficiently high quality is hard to be manufactured in a stable manner at the present stage, uniformity in a resistivity distribution along a diameter direction of a silicon single crystal thin film 32 formed on a main surface of the silicon single crystal substrate 12 can be improved.

Further, since, in the example, there is described the case where the p-type silicon single crystal thin film 32 is grown in vapor phase on the main surface of the silicon single crystal substrate 12, there is a tendency that a resistivity distribution of the silicon single crystal thin film 32 is relatively higher in the vicinity of the center and therefore, the dopant gas is additionally supplied into the reaction chamber 10 through the inner inlet ports 18a and 18b, and the middle inlet ports 18c and 18d from the first and second auxiliary dopant gas pipes 22b and 22c.

Since in a case where an n-type silicon single crystal thin film 32 is grown in vapor phase, there arises a tendency that a resistivity distribution of a silicon single crystal thin film 32 is relatively high in the vicinity of the periphery, it is preferably that the dopant gas is additionally supplied into the reaction chamber 10 through the outer inlet ports 18e and 18f, or the outer inlet ports 18e and 18f and the middle inlet ports 18c and 18d, from an auxiliary dopant gas pipe.

Furthermore, since there arises a case where a resistivity of a silicon single crystal thin film 32 has a locally higher region otherwise, the dopant gas, in the case, is additionally supplied through a specific gas inlet port corresponding to the region, that is one or two kinds of inlet ports selected from the group consisting of the inner inlet ports, the outer inlet ports and the middle inlet ports, from an auxiliary dopant gas pipe.

Further, while, in the above described example, the dopant gas is additionally supplied into the reaction chamber 10 through the inner inlet ports 18a and 18b, and the middle inlet ports 18c and 18d from the first and second auxiliary dopant gas pipes 22b and 22c, $H_2$ gas can be supplied instead of the dopant gas. In this case, the dopant gas supplied through all of the inlet ports 18a to 18f from the common gas pipe 22a functioning as the main dopant gas pipe can be locally diluted. To be detailed, $H_2$ gas is additionally supplied through a specific gas inlet port corresponding to a local region of low resistivity of the silicon single crystal thin film 32 from an auxiliary dopant gas pipe, and thereby, a resistivity distribution of the silicon single crystal thin film 32 can be uniform, similar to the case of the example.

INDUSTRIAL APPLICABILITY

As described above, according to a semiconductor wafer and a vapor phase growth apparatus, relating to the invention, the following effects can be exerted.

That is, a semiconductor wafer relating to the invention is constructed such that even a semiconductor single crystal substrate as large as in the range of from 300 mm to 400 mm in diameter, both limits being included, of a dopant concentration as low as in the range of from $4\times10^{13}$ atoms/cm$^3$ to $3\times10^{18}$ atoms/cm$^3$, both limits being included, is used to form a semiconductor thin film with substantially no slip dislocation generated therein and a resistivity distribution along a diameter within ±3.0% or less, on a main surface of the semiconductor single crystal substrate. Since with a semiconductor wafer relating to the invention, a large diameter and uniform resistivity which a semiconductor wafer in recent years requires are simultaneously achieved, the semiconductor wafer greatly contributes to improvement on increase in throughput and yield in fabrication of semiconductor chips.

Further, according to a vapor phase growth apparatus relating to the invention, there are provided a main dopant gas pipe supplying a dopant gas to all of a plurality of gas inlet ports and an auxiliary dopant gas pipe supplying the dopant gas to a specific gas inlet port and with such a construction, the following operation can be performed: the dopant gas is supplied onto a main surface of a semiconductor single crystal substrate in a reaction chamber through all of the gas inlet ports from the main dopant gas pipe to grow in vapor phase a semiconductor thin film on the main surface of a semiconductor single crystal substrate and realize a global resistivity of the semiconductor thin film in the vicinity of a predetermined target resistivity value and simultaneously to this, the dopant gas is additionally supplied onto the main surface of the semiconductor single crystal substrate in the reaction chamber through the specific gas inlet port from the auxiliary dopant gas pipe to adjust a resistivity distribution of the semiconductor thin film. Hence, with the use of a vapor phase growth apparatus relating to the invention, even when a semiconductor thin film is formed on a main surface of a large diameter semiconductor single crystal substrate, uniform resistivity distribution of the semiconductor thin film can be achieved.

For example, a semiconductor wafer can be provided such that a semiconductor thin film whose resistivity distribution along a diameter is controlled within ±3% or less is formed on a main surface of a semiconductor single crystal substrate of a diameter as large as in the range of from 300 mm to 400 mm, both limits being included, and of a dopant concentration as low as in the range of from $4 \times 10^{13}$ atoms/cm$^3$ to $3 \times 10^{18}$ atoms/cm$^3$, both limits being included.

Further, when a target resistivity of a semiconductor thin film is required to be changed, such a change is realized as follows: after supply conditions f or a dopant gas f rom a main dopant gas pipe and an auxiliary dopant gas pipe are adjusted such that a resistivity distribution along a diameter of a semiconductor thin film is confined, say, within ±3% or less, a supply rate of hydrogen gas as a diluent is adjusted while keeping a ratio of flow rates of the dopant gas fro m the main dopant gas pipe and the auxiliary dopant gas pipe at a value, with the result that a change in target resistivity of the semiconductor thin film can be performed with retained uniformity of a resistivity distribution. Therefore, a change in target resistivity of a semiconductor thin film can be achieved with easily and quickly, leading to improvement on productivity.

Further, according to a more preferable vapor phase growth apparatus relating to the invention, a plurality of gas inlet ports are grouped into three kinds including the inner inlet ports, outer inlet ports and the middle inlet ports, and a specific gas inlet port to which the auxiliary dopant gas pipe supplies the dopant gas is one or two selected from the three kinds of gas inlet ports. With such a construction, since the dopant gas can be additionally supplied through a specific gas inlet port corresponding to a local region with high resistivity of a semiconductor thin film grown in vapor phase on a main surface of a semiconductor single crystal substrate, that is through one or two selected from the group consisting of the inner inlet ports, the outer inlet ports and the middle inlet ports, from an auxiliary dopant gas pipe, uniform resistivity distribution of a semiconductor thin film formed on the main surface of a semiconductor single crystal substrate can be achieved.

Further, according to a more preferable vapor phase growth apparatus, a main dopant gas pipe and an auxiliary dopant gas pipe are equipped with respective dopant gas flow rate regulators. With such a configuration, since a flow rate of the dopant gas supplied through all of the gas inlet ports onto a main surface of a semiconductor single crystal substrate from a main dopant gas pipe and a flow rate of the dopant gas supplied additionally to a local region of the main surface of the semiconductor single crystal substrate through a specific gas inlet port from an auxiliary dopant gas pipe are individually controlled, a resistivity distribution of a semiconductor thin film can be adjusted to a high precision, thereby enabling more uniform resistivity distribution along a diameter of the semiconductor thin film to be achieved, even when the semiconductor thin film is formed on a main surface of a large diameter semiconductor single crystal substrate.

What is claimed is:

1. A semiconductor wafer obtained by forming a semiconductor thin film with a resistivity distribution along a diameter within ±3% or less on a main surface of a semiconductor single crystal substrate of a diameter ranging 300 mm to 400 mm, both limits being included, and a dopant concentration ranging from $4 \times 10^{13}$ atoms/cm$^3$ to $3 \times 10^{18}$ atoms/cm$^3$, both limits being included and wherein a conductivity type of the semiconductor single crystal substrate is p and a resistivity thereof ranges from 0.03 Ω·cm to 300 Ω·cm, both limits being included.

2. A semiconductor wafer according to claim 1, wherein the resistivity of the semiconductor single crystal substrate ranges from 1 Ω·cm to 20 Ω·cm, both limits being included.

3. A semiconductor wafer according to claim 1, wherein boron is used as a dopant added to the semiconductor single crystal substrate.

4. A semiconductor wafer according to claim 2, wherein boron is used as a dopant added to the semiconductor single crystal substrate.

5. A semiconductor wafer according to claim 1, wherein a diameter of the semiconductor single crystal substrate is 300 mm in length.

6. A semiconductor wafer according to claim 1, wherein the semiconductor single crystal substrate is a silicon single crystal substrate and the semiconductor thin film is a silicon single crystal thin film.

7. A semiconductor wafer according to claim 2, wherein the semiconductor single crystal substrate is a silicon single crystal substrate and the semiconductor thin film is a silicon single crystal thin film.

8. A semiconductor wafer according to claim 3, wherein the semiconductor single crystal substrate is a silicon single crystal substrate and the semiconductor thin film is a silicon single crystal thin film.

9. A semiconductor wafer according to claim 4, wherein the semiconductor single crystal substrate is a silicon single crystal substrate and the semiconductor thin film is a silicon single crystal thin film.

10. A semiconductor wafer according to claim 5, wherein the semiconductor single crystal substrate is a silicon single crystal substrate and the semiconductor thin film is a silicon single crystal thin film.

* * * * *